(12) United States Patent
Vedantam et al.

(10) Patent No.: US 9,910,951 B2
(45) Date of Patent: Mar. 6, 2018

(54) MITIGATING WIRE CAPACITANCE IN AN INTEGRATED CIRCUIT

(71) Applicant: ORACLE INTERNATIONAL CORPORATION, Redwood Shores, CA (US)

(72) Inventors: Kiran Vedantam, Santa Clara, CA (US); James G. Ballard, Palo Alto, CA (US); Hsiangwen Lin, Menlo Park, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 71 days.

(21) Appl. No.: 14/830,938

(22) Filed: Aug. 20, 2015

(65) Prior Publication Data

US 2017/0053054 A1   Feb. 23, 2017

(51) Int. Cl.
 *G06F 17/50*   (2006.01)
 *H01L 27/02*   (2006.01)

(52) U.S. Cl.
 CPC ...... *G06F 17/5077* (2013.01); *H01L 27/0207* (2013.01)

(58) Field of Classification Search
 USPC .......................................................... 716/126
 See application file for complete search history.

(56) References Cited

U.S. PATENT DOCUMENTS

| 7,856,610 | B2 * | 12/2010 | Kitano | ............... | G06F 17/5077 |
| | | | | | 716/129 |
| 2007/0271543 | A1 * | 11/2007 | Alpert | .................. | G06F 17/509 |
| | | | | | 716/114 |

* cited by examiner

*Primary Examiner* — Eric Lee
(74) *Attorney, Agent, or Firm* — Cooper Legal Group, LLC.

(57) ABSTRACT

Systems, methods, and other embodiments associated with mitigating wire capacitance are described. In one embodiment, a method includes loading, by at least a processor into an electronic memory, an electronic data structure that includes a design of an integrated circuit. The design defines layers of the integrated circuit and connections between structures and wire interconnects in the layers. The example method may also include generating, by at least the processor, a structured topology in the design by successively routing the wire interconnects throughout the layers according to coordinates of the structures in the design and weighted values associated with each of the structures to mitigate wire capacitance of the wire interconnects.

20 Claims, 9 Drawing Sheets

MITIGATING WIRE CAPACITANCE IN AN INTEGRATED CIRCUIT

BACKGROUND

Wire capacitance in an integrated circuit refers to capacitance that exists between two or more adjacent wires and capacitance between the wires and ground. Wire capacitance may also be referred to as stray capacitance or parasitic capacitance because the wire capacitance may cause difficulties with operation of the integrated circuit.

For example, the wires (also referred to as interconnects) connect different components within the integrated circuit by carrying electric signals (e.g., power and/or data) between the components. When an electric current is applied to the wires, noise can be introduced into signals carried by the wires because of the wire capacitance. Consequently, this noise may interfere with operation of the integrated circuit.

Similarly, the capacitance to ground of a wire may also cause difficulties in operation of the integrated circuit. For example, the capacitance to ground adds to a capacitance of other devices that are part of the integrated circuit like gates of transistors. This capacitance should be charged/discharged in order to propagate a voltage level of 0 or 1 further down a connection in the integrated circuit. In general, increasing an amount of capacitance to ground in the integrated circuit has an effect of increasing a time to reach an appropriate voltage level before a next stage in the circuit may construe a digital state from the voltage level as being a 0 or 1. Thus, reducing the wire capacitance may influence (e.g., increase) a frequency at which the integrated circuit can function.

Existing remedies to mitigate difficulties with wire capacitance quickly become inadequate to resolve dramatically increasing numbers of interconnects on circuits with smaller metal geometries. Existing remedies are also limited by increasingly stringent and complex design rules set by integrated circuit manufacturers as technologies advance over time.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Systems, methods, and other embodiments are described herein that are associated with mitigating wire capacitance in an integrated circuit by intelligently routing wire interconnects to reduce overall wire length. Capacitance between wire interconnects of an integrated circuit (referred to as wire capacitance) can cause noise in signals carried by the wire interconnects and in addition to effecting a frequency at which the integrated circuit can function from an increased capacitance to ground. For example, the integrated circuit includes successive layers of wires that are routed in such a way as to connect different structures of a structure/node layer. Because of the close geometry of many of the wire interconnects an inherent capacitance exists between the wire interconnects and to ground.

Accordingly, in one embodiment, designing the integrated circuit involves minimizing lengths of the wire interconnects in order to mitigate difficulties with wire capacitance. Minimizing lengths of the wire interconnects is accomplished, in one embodiment, by routing the wire interconnects to be proximate to structures that are being connected. That is, for example, a trunk interconnect may be generated so that an x-coordinate along which the trunk extends is centrally located to the structures. By centrally locating the trunk interconnect and wire interconnects of subsequent layers, the wire interconnects have a reduced length because distances from the wire interconnects to the structures are minimized. In this way, wire capacitance is mitigated by minimizing lengths of the wire interconnects overall.

Figure 1:
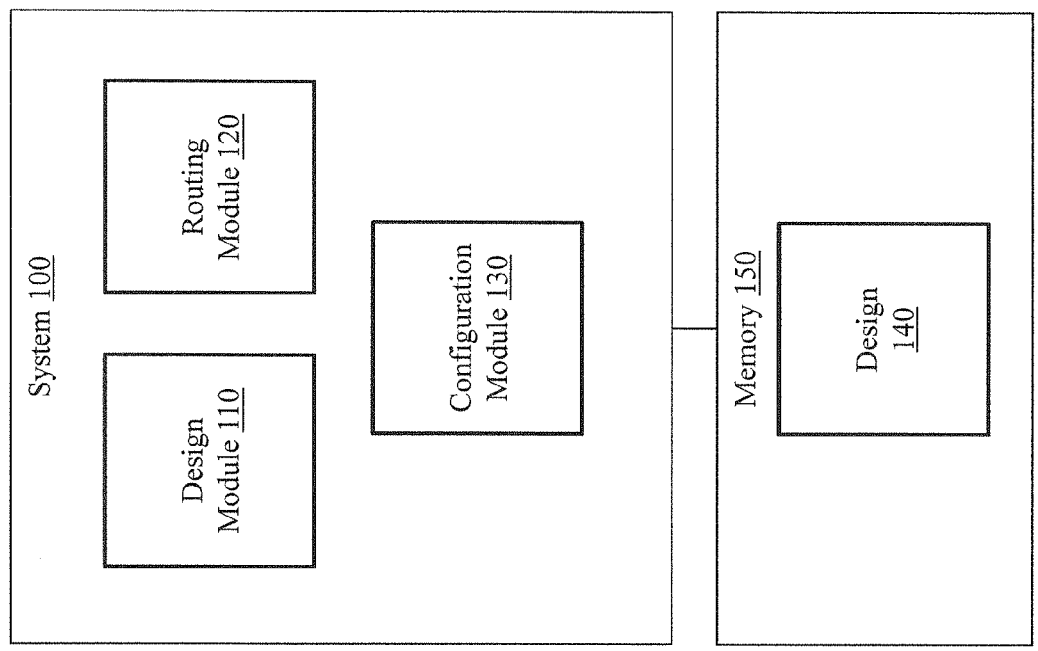
FIG. 1 illustrates one embodiment of a system associated with mitigating wire capacitance in an integrated circuit.

With reference to FIG. 1, one embodiment of a computerized system 100 associated with mitigating wire capacitance in a design of an integrated circuit is illustrated. The system 100 includes a design module 110, a routing module 120, and a configuration module 130. In general, the modules 110-130 function to automatically produce a design 140 of an integrated circuit with elements designed to mitigate effects of wire capacitance. In one embodiment, system 100 includes electronic computing components including a processor for executing instructions and operating with the modules, an electronic memory 150 for storing data and executable instructions, and communication channels connecting the components.

Consider that an integrated circuit includes many different layers that form transistors, capacitors, resistors, wires, bonding sites, insulating layers, and so on. The different layers are typically segmented into two groups, front end of line (FEOL) layers and back end of line (BEOL) layers. In general, the FEOL layers are fabricated first and include, for example, transistors (e.g., CMOS), resistors, and/or capacitors. The BEOL layers are fabricated on top of the FEOL layers. The BEOL layers (also referred to as the metal layers) include wire interconnects that interconnect elements of the FEOL layers. That is, the wire/metal interconnects of the BEOL layers connect elements/structures of the FEOL layers to form circuits (also referred to as nets). The FEOL and BEOL layers form an integrated circuit that may be disposed within an integrated circuit package.

In one embodiment, the BEOL layers include multiple layers (e.g., 2, 3, 4, or more) of wire interconnects, as defined by the manufacturing process. Accordingly, the design 140 for the integrated circuit is complex. Often, a design tool such as an electronic design automation (EDA or EGAD) tool is used to design (e.g., place components, route wire interconnects, and so on) the integrated circuit due to the complexity and scale of the design 140. Furthermore, the EDA tool can be configured to account for various problems (e.g., wire capacitance effects) and ensure that designs do not violate rules (e.g., design rule checking (DRC)) that prevent problems in the integrated circuit.

With continued reference to FIG. 1, the design 140 represents a design of an integrated circuit that includes both FEOL and BEOL layers. However, for purposes of this disclosure, reference to the design 140 will generally refer to the BEOL layers of the integrated circuit and not the FEOL layers. Accordingly, in one embodiment, the system 100 is an EDA tool, a non-transitory computer-readable medium configured to execute on a device and cause the device to operate as disclosed, or other automated device that produces BEOL layers of the design 140.

Additionally, the design 140, itself, is part of an electronic data structure that describes a layout of structures of the integrated circuit. In one embodiment, the configuration module 130 is configured to load the electronic data structure that includes the design 140 into electronic memory 150. The memory 150 is a computer-readable storage medium, such as, an electronic random access memory (RAM), a hardware cache, a hard disk drive, and so on. In either case, the design 140 is received by the configuration module 130 and stored into the memory 150. Thus, information stored in the data structure that describes different aspects of the design 140 is quickly accessible for analysis and modification by the system 100 from being transformed into a format that can be stored in the memory 150.

Additionally, the configuration module 130 is configured to receive electronic input (e.g., network communications, electrical input from an interface device, etc.) that specifies parameters for producing the design 140. The parameters can include a driver size (i.e., describing a rate of electrical current generated by a circuit device output in the integrated circuit), an amount of capacitive load to be carried by the wire interconnects, an indicator of whether to use parallel pillar metals (i.e., successive layers of wire interconnects alternating in orientation) for missing connections between multiple layers, an indicator of how many layers to route the wire interconnects throughout the design 140, and so on. In general, the parameters specify information that influences how the wire interconnects are to be configured and routed in the design 140. Accordingly, in one embodiment, the configuration module 130 configures the system 100 to account for wire capacitance by minimizing overall wire interconnect lengths in the design 140 of the integrated circuit.

The wire interconnects are, for example, rectangular segments of metal in layers of the design 140 with decreasing widths with successively lower layers that are to carry electrical signals between different structures/nodes of the integrated circuit. In one embodiment, the wire interconnects are configured to carry electrical current to various structures of the integrated circuit by connecting the structures into a net. As used herein, "net" refers to structures and wire interconnects that are electrically connected together into a single electrical circuit.

When determining how to route the wire interconnects in the design 140 to form a net, the system 100 accounts for many different considerations. For example, the design module 110 is configured to locate structures in the design 140 of the integrated circuit that are to be electrically connected in the net. That is, the design module 110 determines locations of existing structures in a structure layer of the BEOL layers that abut, for example, the FEOL layers of the design 140.

In one embodiment, the design module 110 identifies coordinates for each of the structures in an x, y coordinate system from a top down perspective of the design 140. The coordinates identify a position of each of the structures within a two-dimensional design space. In one embodiment, the structures that are to be connected in the net are a subset of structures present in the design 140. Accordingly, the design module 110 constructs, for example, a map or graph of the locations of the structures that are to be wired into the net in order to isolate the structures from the rest of the design 140 when performing the disclosed functions.

Furthermore, the design module 110 may also map open tracks or free spaces with no existing structures where the wire interconnects can be placed. In this way, the design module 110 can identify different possible spaces in each layer that do not include structures which would obstruct routing the wire interconnects.

Figure 2:
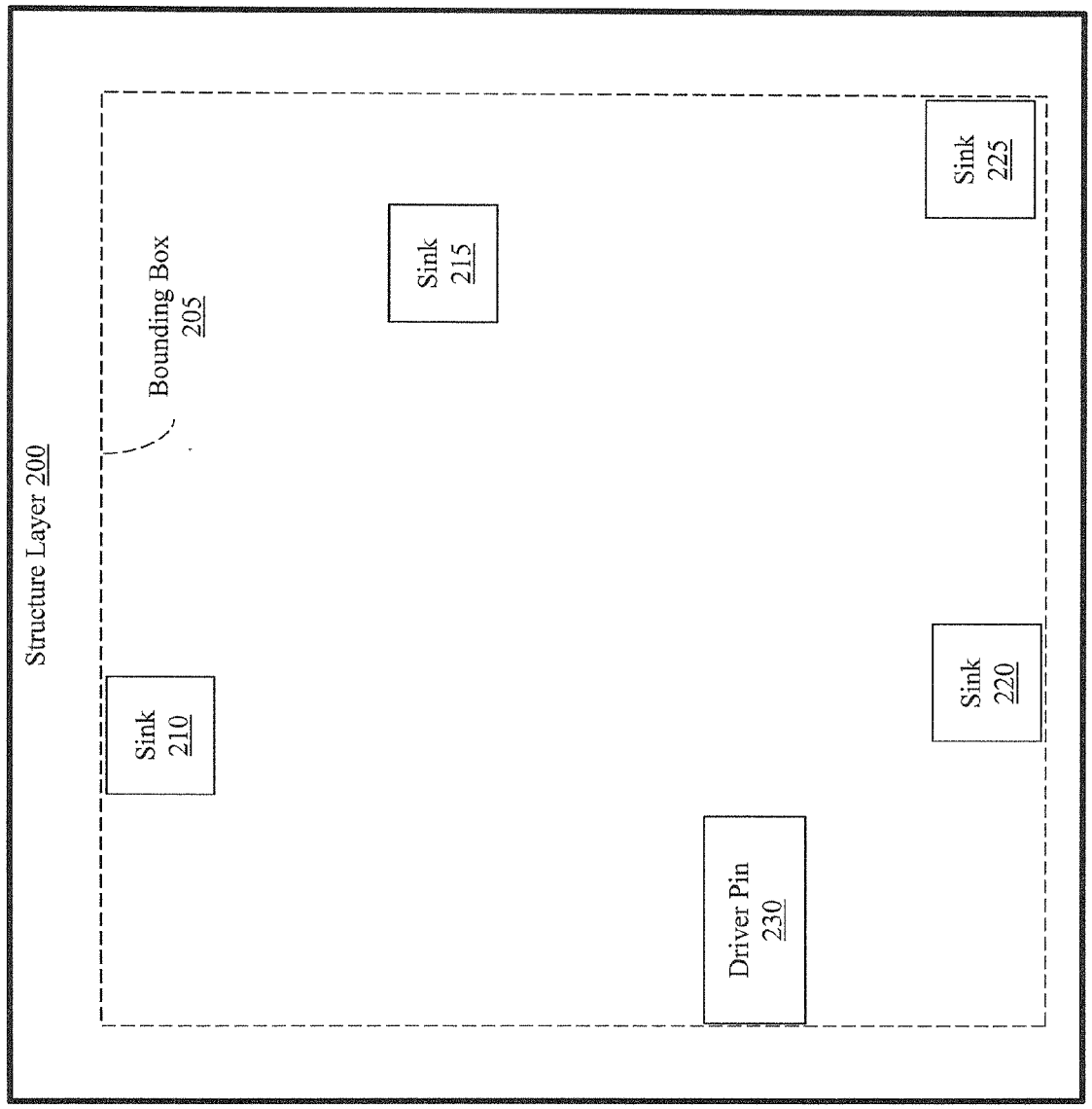
FIG. 2 illustrates one embodiment of a structure layer of an integrated circuit design.

With reference to FIG. 2, one embodiment of a structure layer 200 (also referred to as a node layer) is illustrated. In general, the structure layer 200 is a layer of the design 140 that is, for example, adjacent to FEOL layers of the design 140. That is, the structure layer 200 acts as a transition between BEOL layers of wire interconnects and actual structures of the FEOL layers. Accordingly, the structure layer 200 is illustrated with multiple different structures that are to be connected into a net.

In FIG. 2, a bounding box 205 defines a subregion of the design 140 that includes structures that are to be connected together. The structures include current sinks 210, 215, 220, 225 and a driver pin 230. The current sinks 210, 215, 220, 225 are, for example, clk line inputs, data inputs, mux select lines, inputs to logic gates, inputs to flip-flops, inputs to latches or other modules and so on. In the present embodiment, the structure layer 200 also includes the driver pin 230 that is a current source or other signal source for the current sinks 210, 215, 220, 225.

Furthermore, returning to operation of the design module 110, the design module 110 is configured to generate the bounding box 205 around the structures to define an area where the wire interconnects will be routed layer-by-layer. That is, the structures (210, 215, 220, 225, 230) for the net may be initially defined or grouped together according to an electronic input to identify which structures are to be connected. However, the design module 110 automatically generates the bounding box 205 to ensure that the wire interconnects are generated proximate to the structures and within a defined area.

For example, the design module 110 generates the bounding box 205 as a function of the coordinates of the structures 210, 215, 220, 225, 230. In general, the design module 110 may sort or otherwise analyze the coordinates to determine which coordinates are outermost coordinates. That is, the design module 110 identifies which of the coordinates are outermost coordinates in an x-direction to define either side of the bounding box 205 and which coordinates are outermost coordinates in a y-dimension to define a top and a bottom of the bounding box 205. In this way, the design module 110 may identify and define an area within the design 140 where the wire interconnects are to be routed.

While the bounding box 205 is discussed initially in relation to the structure layer 200 and the structures 210, 215, 220, 225, 230, the bounding box 205 is a design construct that is used by the routing module 120 on multiple layers of the design 140 to restrict a region within which the wire interconnects are routed. For example, the routing module 120 applies the bounding box 205 to other layers in which the wire interconnects are to be routed in order to control where the wire interconnects are ultimately placed.

Figure 3:
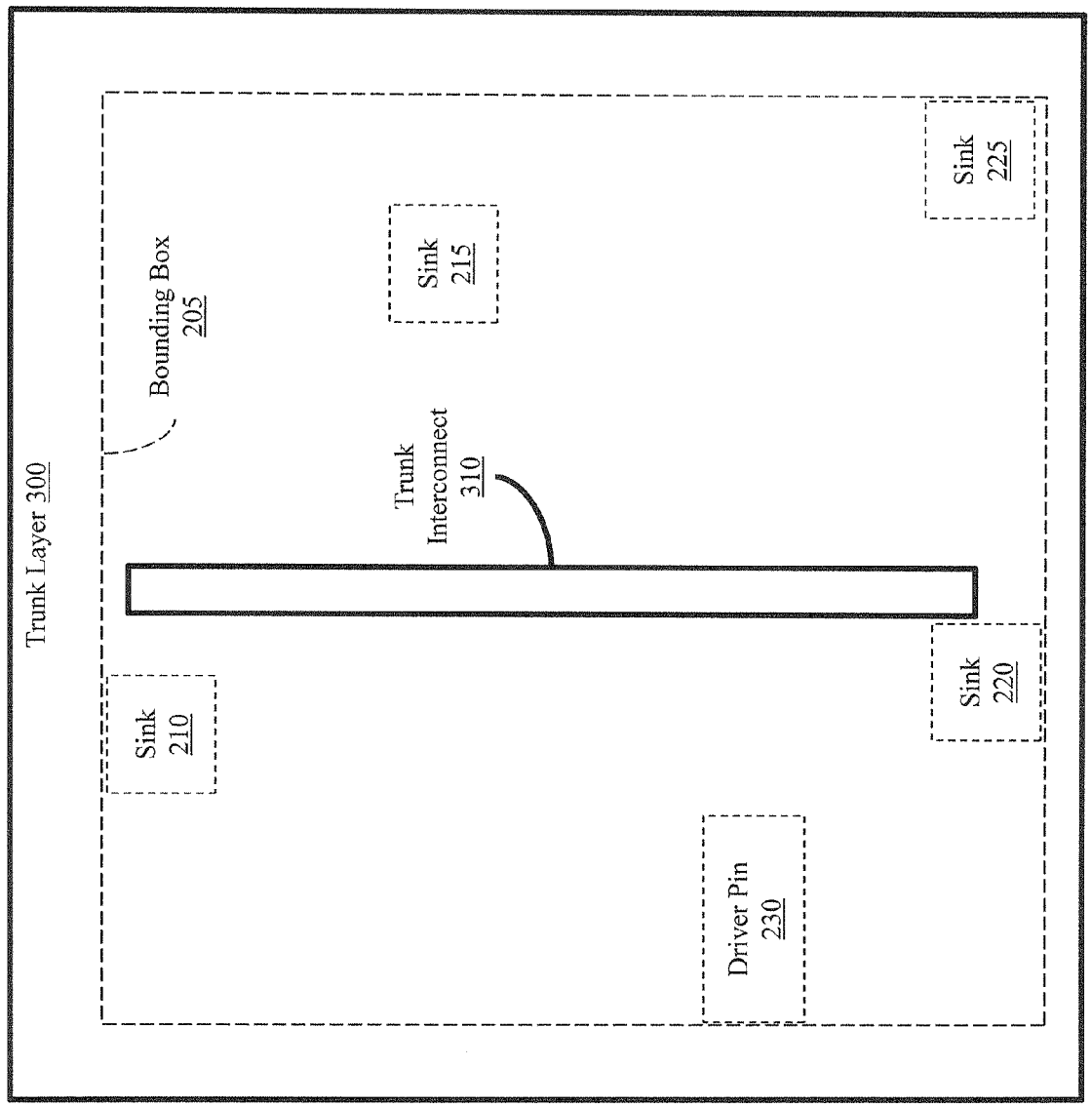
FIG. 3 illustrates one embodiment of a trunk layer of an integrated circuit configured to mitigate wire capacitance effects.

With reference to FIG. 3, one example of a trunk layer 300 is illustrated. The trunk layer 300 is a BEOL layer in the design 140 that is, for example, several layers removed or above the structure layer 200. The trunk layer 300 may be four, five or six or more layers removed from the structure layer 200. Furthermore, while the trunk layer 300 will be discussed as including a trunk interconnect 310, of course, other portions of the layer 300 that are not the focus of this approach may include additional structures and/or other wire interconnects. Additionally, while the trunk layer 300 is discussed as being six layers removed from the structure layer 200, the six layers may include both via layers as well as wire interconnect layers in an alternating arrangement. In general, this discussion will focus on the wire interconnect layers and not the via layers, which are used to connect between each wire interconnect layer.

The routing module 120 initiates routing of the wire interconnects from a top down approach. That is, the routing module 120 begins by routing within the trunk layer 300, which is a furthest specified layer for routing from the structure layer 200. In one embodiment, as an option for configuring how the wire interconnects are routed, the configuration module 130 may receive input that indicates that one, two or three layers of wire interconnects are to be automatically generated with a structured topology of the wire interconnects. Thus, depending on a number of layers initially specified, the trunk layer 300 may be skipped. However, for purposes of this discussion the routing will be discussed as though three layers of wire interconnects have been indicated for routing.

Accordingly, the routing module 120 initiates generation of the structured topology of wire interconnects with the trunk layer 300. To locate the trunk interconnect 310 within the trunk layer 300, in one embodiment, the routing module 120 calculates a central location for the trunk interconnect 310 as a function of the coordinates of the structures. For example, the routing module 110 averages the x-coordinates for all of the structures (i.e., 210, 215, 220, 225, 230) to determine an x-coordinate along which the trunk interconnect 310 is vertically generated.

Of course, while an x-coordinate is discussed, the trunk interconnect 310 may be generated along a y-coordinate as well. In general, the choice of the x-dimension or the y-dimension for the trunk interconnect 310 depends on parameters specified to the configuration module 130 and/or properties of the trunk layer 300. In either case, whichever dimension is selected, successive layers of interconnects are oriented so as to be perpendicular in routing direction to wire interconnects of adjacent layers. In this way, the routing module 120 ensures points of intersection between wire interconnects of different layers that provide locations to generate vias.

Furthermore, in one embodiment, the routing module 120 applies weighted values associated with each of the structures to the x-coordinates prior to calculating the position for the trunk interconnect 310. By weighting the coordinates, the routing module 120 causes the position of the trunk interconnect 310 to be shifted closer to structures of greater weight. Structures of greater weight are, for example, structures that carry a greater capacitive load than other structures, structures that hold a key location in the design 140, structures with a larger area, and so on. In one embodiment, the weighting values may be automatically generated by the configuration module 130 according to, for example, structure size or may be received as input by the configuration module 130.

Thus, the routing module 120 applies weighting values to coordinates of the structures prior to averaging the coordinates. Consequently, the trunk interconnect 310 can be generated at a closer proximity to a structure that has a higher weighting value. As shown in FIG. 3, the driver pin 230 is weighted higher than the current sinks 210, 215, 220, and 225. Therefore, an x-coordinate for the trunk interconnect 310 is weighted more heavily toward the driver pin 230. As seen in FIG. 3, the result is that the routing module 120 generates the trunk interconnect 310 in a position that is slightly closer to the driver pin 230.

Figure 4:
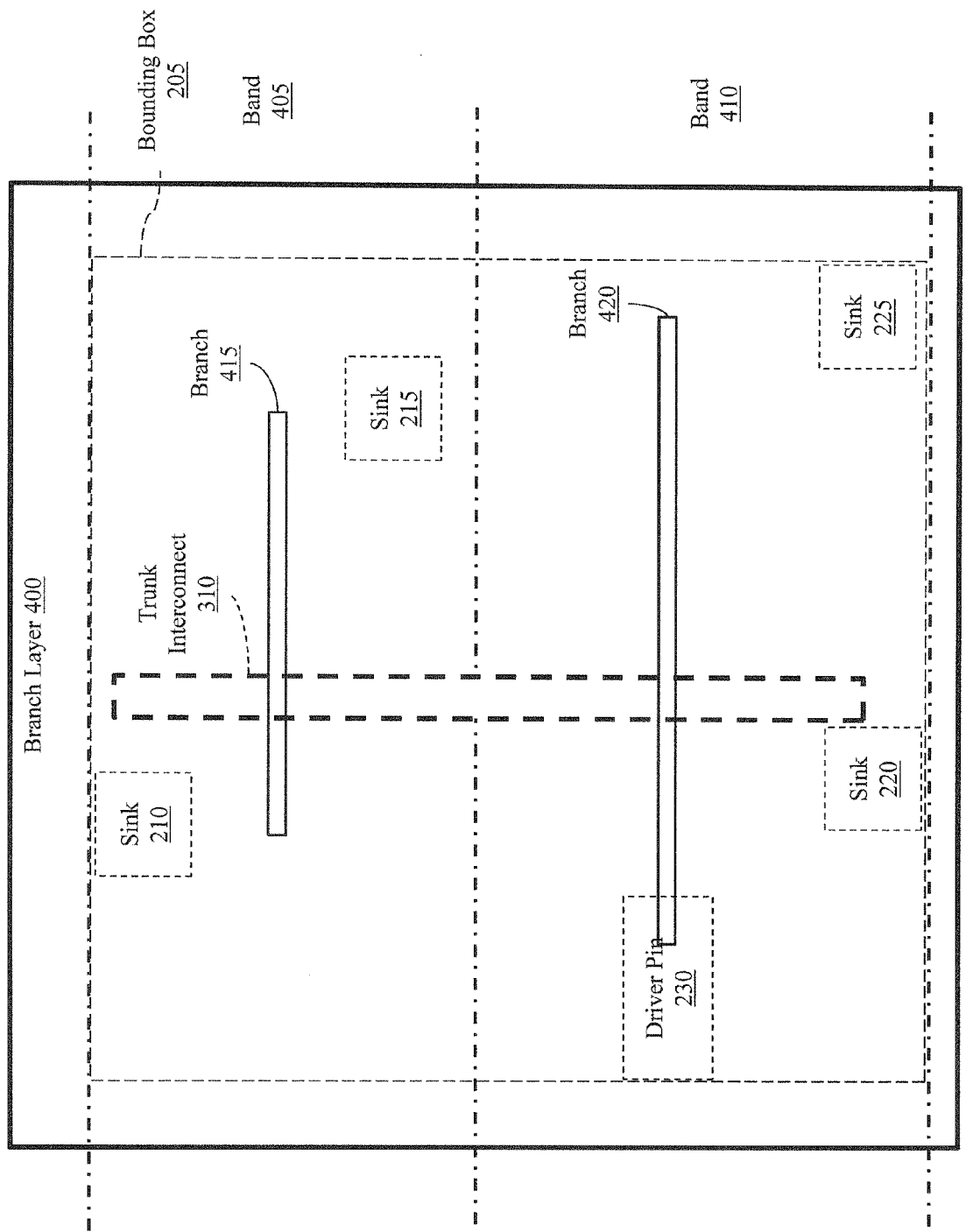
FIG. 4 illustrates one embodiment of a branch layer of an integrated circuit configured to mitigate wire capacitance effects.

With reference to FIG. 4, one embodiment of a branch layer 400 is illustrated. The branch layer 400 is an adjacent wire interconnect layer to the trunk layer 300. The branch layer 400 is beneath the trunk layer 300 and is separated from the trunk layer 300 by a via layer (see FIG. 6). As shown in FIG. 4, the routing module 120 initially slices the bounding box 205 into two bands, band 405 and band 410 to determine possible locations for branch interconnects. Subsequently, the routing module 120 generates a branch 415 in band 405 and a branch 420 in band 410.

The routing module 120 may slice the bounding box 205 in uniform bands that are perpendicular to a routing direction of the trunk interconnect 310. Thus, as illustrated in FIG. 4, the bounding box 205 is sliced with horizontal lines at different y-coordinates. More generally, slicing the bounding box 205 may take several different forms. That is, the routing module 120 may slice the bounding box 205 into uneven segments that are defined according to specified parameters, or may slice the bounding box 205 to evenly distribute structures into different bands. Additionally, while two bands are illustrated the routing module 120 may also be configured to generate additional bands for placing additional branch interconnects.

In either case, the routing module 120, subsequent to slicing the bounding box 205 into bands, assigns structures to the bands. That is, in some circumstances a structure, such as sink 215, if located slightly lower from the present position, may fall on a boundary of both the band 405 and the band 410. Thus, the routing module 120 may analyze the sink 215 along with locations of other structures in both bands to determine whether including the sink 215 in band 405 or in band 410 minimizes wire capacitance in the design 140.

Consider that including the sink 215 in band 405 results in the branch 415 being generated as illustrated in FIG. 400. However, if the sink 215 is instead assigned to the band 410, then the branch 420 would still be generated as shown, but the branch 415 would not be generated to extend to the right of the trunk 310. Thus, excessive wire could be removed from the design 140 to mitigate wire capacitance.

However, as illustrated in FIG. 4, assigning the sink 215 to the band 410 would not mitigate any additional wire capacitance because of a length of a leg that would extend from the branch 420. Consequently, the routing module 120 assigns the structures to the respective bands according to a center point of each of the structures as illustrated in FIG. 4.

In general, when a structure falls on a boundary, the routing module 120 assigns the structure to a band according to which band includes a second structure that is most proximate, if present at all. Additionally, the routing module 120 may assign no structures to a band if the band is too sparsely populated. That is, the routing module may eliminate an entire branch and re-assign structures to adjacent bands. In this way, generating extra branches can be avoided and, thus, wire capacitance can be mitigated.

Continuing with FIG. 4, the routing module 120 assigns sinks 210 and 215 to the band 405 and the driver pin 230, the sink 220, and the sink 225 to the band 410. Subsequently, the routing module 120 generates a branch within each band. As previously mentioned, the routing module 120 generates a branch in a band if the band includes at least one structure that has been assigned to that band. Furthermore, similar to generating the trunk interconnect 310, the routing module 120 generates branch interconnects to be proximate to the structures in a band. That is, the routing module 120 is configured to generate the branches according to the coordinates of the structures by, for example, averaging the coordinates. Additionally, the routing module 120 may also apply weighting values to the structures to determine coordinates for routing the branches in a similar fashion as with the trunk interconnect 310.

Furthermore, in regards to lengths of the branches 415 and 420, the routing module 120 generates the branch 420 to extend over the driver pin 230 while extending toward the sink 225 sufficiently far enough to permit a perpendicular leg to extend from the branch that reaches the sink 225. Similarly, the routing module 120 generates the branch 415 with a length that extends to center points of the sinks 210 and 215 in the x-dimension. In this way, the branches are generated to extend/span only far enough that a leg in a subsequent layer may be extended perpendicular from the branch to intersect the sink. In one embodiment, the branches are trimmed after routing of all layers is complete. In this way, a length of the branches is assured to be only as long as needed to provide for connections to the sinks.

Figure 5:
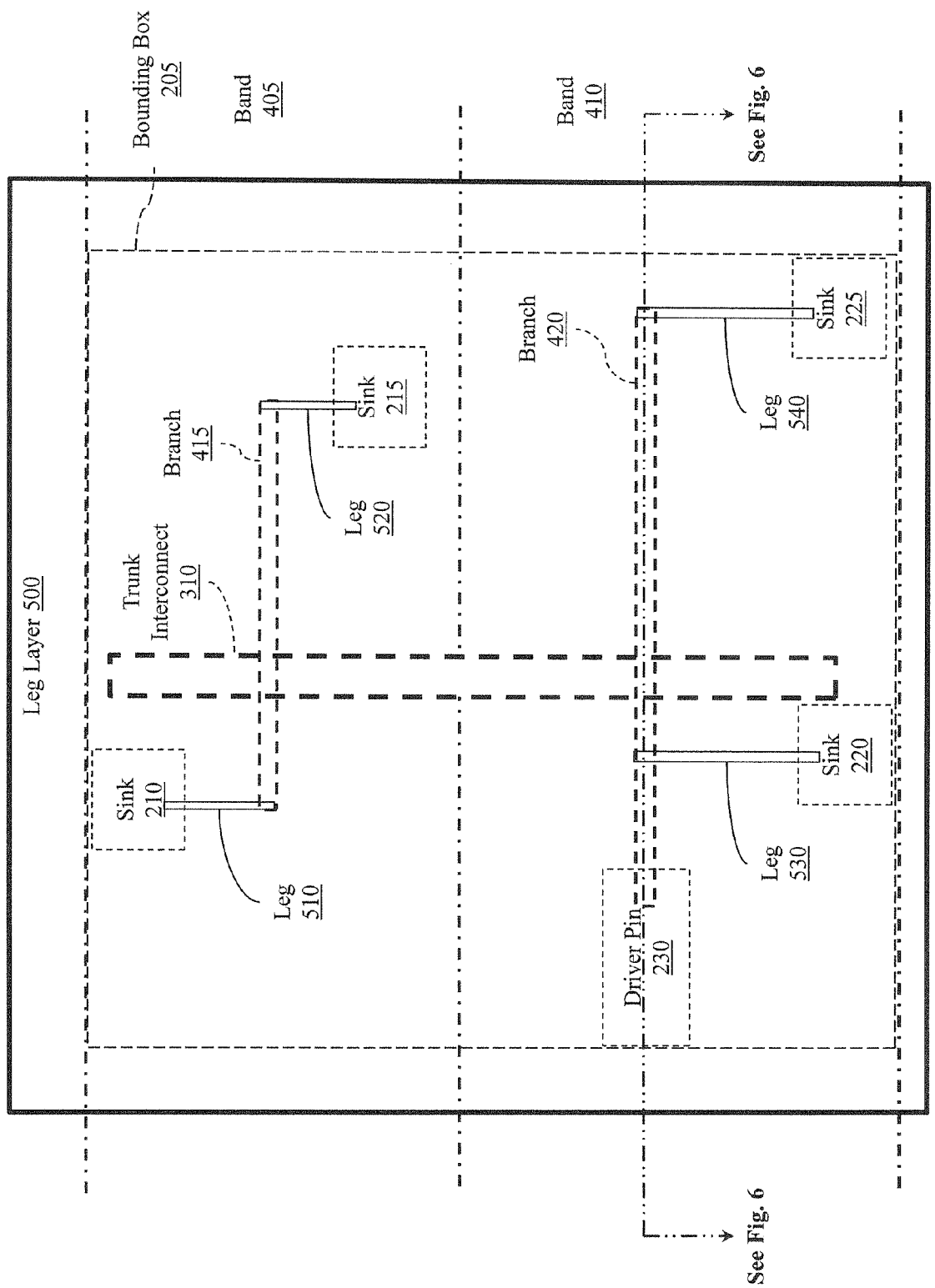
FIG. 5 illustrates one embodiment a leg layer of an integrated circuit associated with mitigating wire capacitance.

With reference to FIG. 5, one example of a leg layer 500 is illustrated. The leg layer 500 illustrates leg interconnects 510, 520, 530 and 540 routed by the routing module 120. In one embodiment, the routing module 120 is configured to route a leg to connect to a center point of a structure. Accordingly, the routing module 120 generates the legs perpendicular to a branch and toward a center of a structure.

However, in some circumstances, the routing module 120 generates a leg to be offset from a center point of a structure and/or to completely pass across a structure. For example, the routing module 120 attempts to generate as few legs as possible while also minimizing a length of each leg. Thus, if, for example, two structures are aligned such that the routing module 120 can connect a branch to both of the structures with a single leg that extends perpendicular to a routing direction of the branch, then the routing module 120 generates the leg according to this scheme.

As an example, consider FIG. 5 and the leg 540. As illustrated, the routing module 120 has generated the leg 540 to extend perpendicularly from the branch 420 toward a center point of the sink 225. However, if another sink (not illustrated) existed between the sink 225 and the branch 420 that was slightly offset from the center point of the sink 225 but still overlapped by at least a portion of the breadth of the sink 225 then a single extension of the leg 540 from the branch 420 could be generated to pass through both sinks at an averaged coordinate of the two.

Additionally, in one embodiment, once the routing module 120 generates the legs, the routing module 120 proceeds to generate vias where the trunk interconnect 310 overlaps the branches 415 and 420, where the branches 415 and 420 overlap the legs 510, 520, 530, and 540 and where the legs overlap the sinks 210, 215, 220, and 225. Furthermore, the routing module 120 also generates vias to connect the branch 420 directly to the driver pin 230. In this way, the routing module 120 generates a structured topology of wire interconnects throughout the design 140 to create the net.

Figure 6:
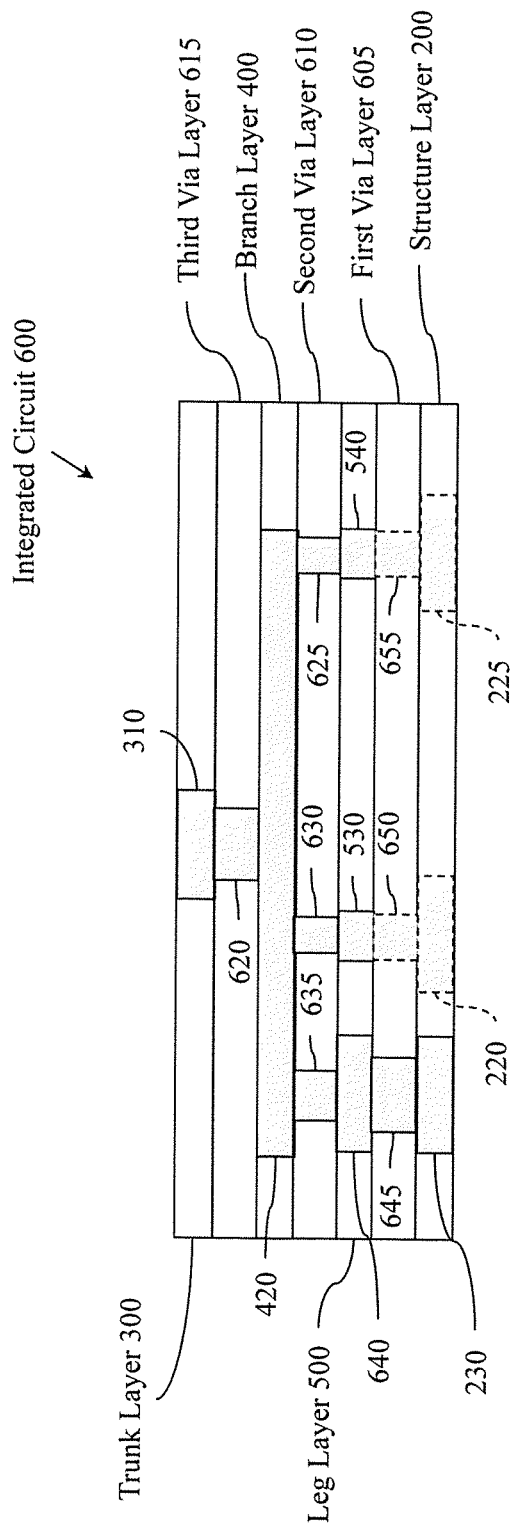
FIG. 6 illustrates one embodiment of a side cross section of an integrated circuit configured for mitigating wire capacitance effects.

The vias generated to connect the wire interconnect layers are illustrated in FIG. 6. FIG. 6 illustrates a cross section of the integrated circuit 600 at a cut line as specified in FIG. 5. FIG. 6 illustrates how via layers 605, 610, and 615 provide via connections 620, 625, 630, 635, 640, 645, 650 and 655 between the trunk layer 300, the branch layer 400, the leg layer 500 and the structure layer 200. It should be noted, that in FIG. 6 current sinks 220 and 225 and vias 650 and 655 are illustrated with dashed lines since they are not on the cut-line but are shown for purposes of explanation.

Furthermore, while the system 100 is discussed generally as a computing system, in one embodiment, the system 100 is a computing/data processing system including an application or collection of distributed applications for enterprise organizations. The applications and computing system 100 may be configured to operate with or be implemented as a cloud-based networking system, a software as a service (SaaS) architecture, or other type of networked computing solution. In one embodiment the system is a centralized server-side application that provides at least the functions disclosed herein and that is accessed by many users via computing devices/terminals communicating with the system 100 (functioning as the server) over a computer network.

In one embodiment, one or more of the components described herein are configured as program modules stored in a non-transitory computer readable medium. The program modules are configured with instructions that when executed by at least a processor cause the computing device to perform the corresponding function(s).

Figure 7:
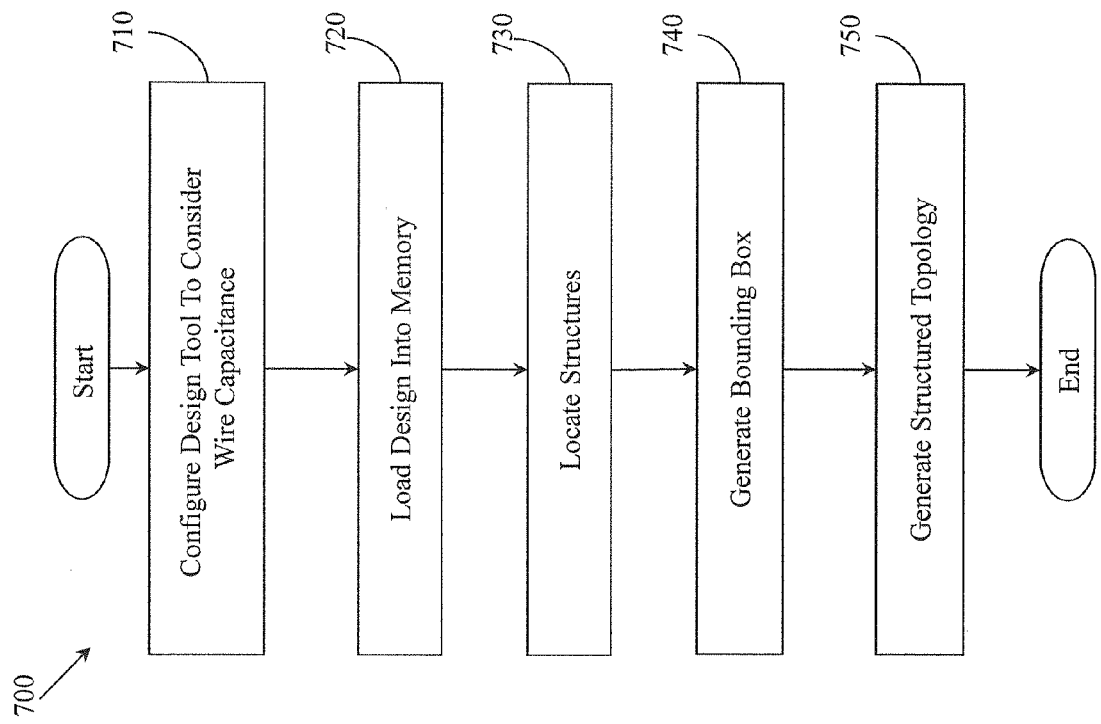
FIG. 7 illustrates one embodiment of a method associated with mitigating wire capacitance effects in an integrated circuit by intelligently routing wire interconnects.

Further details about successively routing wire interconnects to mitigate effects of wire capacitance will be discussed in relation to FIG. 7. FIG. 7 illustrates a method 700 associated with mitigating the effects of wire capacitance in an integrated circuit. In general, method 700 is performed by a computing device programmatically that at least reads, analyzes, generates and/or alters/transforms electronic data of a circuit design. Thus, method 700 will be discussed from the perspective of a computing device similar to the computing system 100 of FIG. 1.

At 710, an electronic design tool is configured according to a set of parameters to mitigate wire capacitance in an integrated circuit. In one embodiment, the design tool is intrinsically integrated as part of electronic computing system to manipulate an electronic data structure that includes a design of the integrated circuit. Accordingly, the electronic design tool may receive the set of parameters to configure different variables in regards to how wire capacitance is mitigated in the integrated circuit.

For example, the set of parameters may include different weighting values for structures that are to be connected in a net, identifiers of the structures to be connected in the net, indicators identifying how many layers of wire interconnects to route, sizes of vias to be used to connect the layers, a desired number of bands, a weight value for a driver pin, a width/height of bands for slicing, whether bands are to be uniform or asymmetric, and so on.

As specified in relation to FIG. 1, the structures may include contacts, wires, resistors, current sinks, driver pins, and bonding sites that are part of a front end of line (FEOL) layer in the design of the integrated circuit.

At 720, an electronic data structure that includes a design of an integrated circuit is loaded into an electronic memory. In one embodiment, the design specifies information such as a graph, map or other data that indicates a layout of structures, wires, vias, layers and other components that form the integrated circuit. The design may further specify attributes of the components of the integrated circuit along with locations and other information that may be used for fabricating the integrated circuit.

At 730, structures that are to be electrically connected in a net are located. In one embodiment, the structures are initially identified along with the configuration parameters. Alternatively, the structures are automatically identified as members of the net that are selected for generation of the wire interconnects. In either case, the structures are located by determining coordinates of the structures within the design. In one embodiment, the coordinates are determined according to an x, y coordinate plane that is superimposed over the design. In this way, the meets and bounds of each structure can easily be determined along with a general area of where the wire interconnects will be routed.

At 740, a bounding box for successively routing the wire interconnects in the design is defined. In one embodiment, the bounding box is a region with a rectangular footprint that bounds the structures. The bounding box is created by, for example, defining a rectangular area around the structures according to the coordinates of the structures. For example, the bounding box is generated to encompass a rectangular footprint within the design that is bounded by outermost coordinates of the structures. Thus, outside edges of the outermost structures define each side of the bounding box. In this way, a region for routing the wire interconnects is restricted to an area proximate to the structures.

At 750, a structured topology of wire interconnects is generated in the design throughout the layers. In general, the structured topology of wire interconnects is generated to electrically connect a driver pin between the layers of the integrated circuit to carry electrical signals to other structures of the integrated circuit, thus, forming the net. In one embodiment, generating the structured topology occurs by successively routing the wire interconnects in the layers of the design according to the coordinates of the structures and a weighted value associated with each of the structures. In this way, the wire interconnects are generated with a minimum length to create the net so that wire capacitance is mitigated in the integrated circuit.

Figure 8:
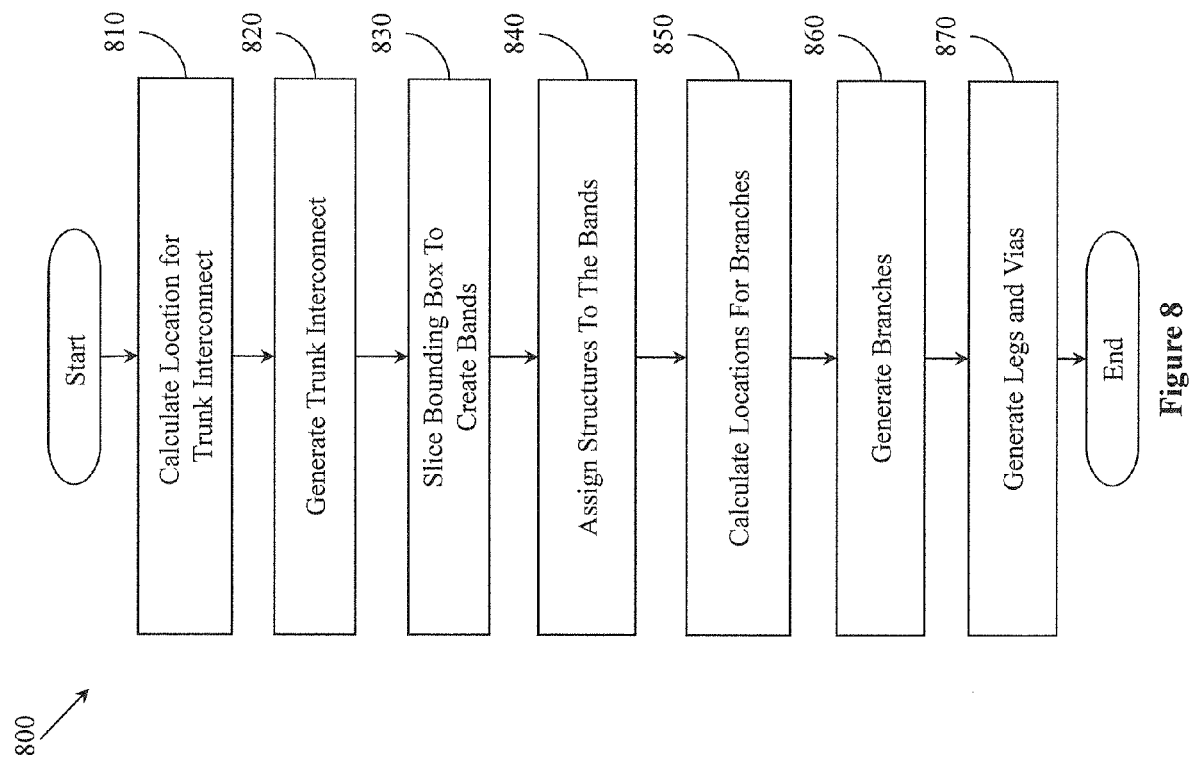
FIG. 8 illustrates one embodiment of a method associated with generating a structured topology in a design to mitigate wire capacitance effects.

Further aspects of generating the structured topology will be discussed in relation to FIG. 8. FIG. 8 illustrates a method 800 that is generally directed to successively routing wire interconnects in an integrated circuit for generating a structured topology. Method 800, in a similar manner as method 700, is performed by a computing device since method 800 operates to alter/transform and create electronic data within an electronic data structure, which cannot be performed manually or mentally by a human. Thus, method 800 will be discussed from the perspective of a computing device similar to the computing system 100 of FIG. 1.

At 810, a location for a trunk interconnect is calculated. The trunk interconnect is, for example, the first interconnect placed for a net. Of course, while the trunk interconnect is discussed as the first interconnect to be placed, configuration parameters may specify to skip placement of the trunk interconnect, if so desired. In either case, the trunk interconnect is placed in an uppermost layer away from a layer that includes the structures.

In one embodiment, a location of the trunk interconnect is calculated according to a weighted average of coordinates for the structures. For example, a routing direction of a layer for the trunk interconnect may first be determined. If the routing direction is vertical (i.e., the y-dimension), then an x-coordinate for each structure is weighted and then an average is calculated. Similarly, if the routing direction is horizontal (i.e., the x-dimension), then a y-coordinate for each structure is used instead. The result of the calculation provides an x or y coordinate along which the trunk interconnect is generated.

At 820, the trunk interconnect is generated according to the coordinates determined at 810. In one embodiment, the trunk interconnect is generated to span the bounding box to ensure that all of the structures can be connected. In another embodiment, the trunk interconnect is generated to have a length that will only reach to where branches are to be generated. Accordingly, in one embodiment, the trunk interconnect may be shortened after the branches are generated to minimize an overall length of the trunk interconnect.

At 830, the bounding box is sliced to create bands. The bands form sub-regions in the bounding box that are used to locate and route branch interconnects. The branch interconnects are routed two layers beneath the trunk interconnect in a perpendicular orientation to the trunk. In this way, a via layer is provided between the trunk and branch layers while also ensuring overlap between the trunk and branches because of the perpendicular orientation.

Furthermore, the bands are generally formed to be uniform in size. However, sizes for the bands and a total number of bands can be modified to account for a particular arrangement of structures. For example, a band may be specified to only span a driver pin so as to ensure a branch is routed directly over the driver pin. Thus, sizes of bands may be explicitly defined for a particular application or a general number of bands may be specified that are automatically generated.

At 840, each of the structures are assigned to a respective one of the bands. In one embodiment, structures are assigned to bands so long as a band is not sparsely populated or a particular structure does not fall onto a boundary between bands. When, for example, a boundary between bands spans a structure, the spanned structure is assigned to either a band that includes a secondary structure that is closest to the spanned structure or to a more heavily populated band. In one embodiment, both options for assigning the structure are analyzed to determine which provides for a minimized wire length. In this way, branch interconnects may be eliminated from sparsely populated bands to minimize overall wire length while also minimizing lengths of leg interconnects.

At 850, locations for branches in the bands are calculated. In general, a location for a branch in each band is calculated in a similar manner as the location for the trunk interconnect. That is, a weighted average of structures in each band is determined for either an x or y coordinate. Either the x or y is selected depending on a routing direction of the trunk interconnect. Thus, if the trunk interconnect is routed in the y-dimension then the branches are routed in the x-dimension so as to be perpendicular to the trunk interconnect and vice versa if the trunk is routed in the x-dimension. Accordingly, y-coordinates are averaged for the branches when the trunk interconnect is routed vertically.

At 860, one or more branch interconnects are generated in the design at locations determined at 850. In one embodiment, a branch interconnect is only generated for a band when the band has at least one structure assigned. Additionally, branches are generated to have a shortest possible length. That is, branches are generated with a length that spans between center points of outermost structures in for a band. In this way, lengths of branches do not extend beyond structures.

At 870, legs are extended from existing branches to the structures and vias are generated between the wire interconnect layers. In one embodiment, the legs are extended from the branches in a perpendicular direction toward the structures. In general, the legs are extended toward a center point of the structures. However, if two or more structures are proximate to each other and partially overlap in a direction from which the leg is being extended, then the leg is offset according to an average of coordinates for the two or more structures. A resulting leg that is generated according to an averaged coordinate overlaps the two or more structures at locations that are offset from the center points. Accordingly, extending a leg for each of the structures can be avoided. In this way, wire length can be minimized to mitigate wire capacitance in the integrated circuit.

Furthermore, once routing of the wire interconnects is complete, via connections are generated between the layers where the wire interconnects overlap. In this way, the net for the structures is completed and the structures are electrically connected.

Computing Device Embodiment

Figure 9:
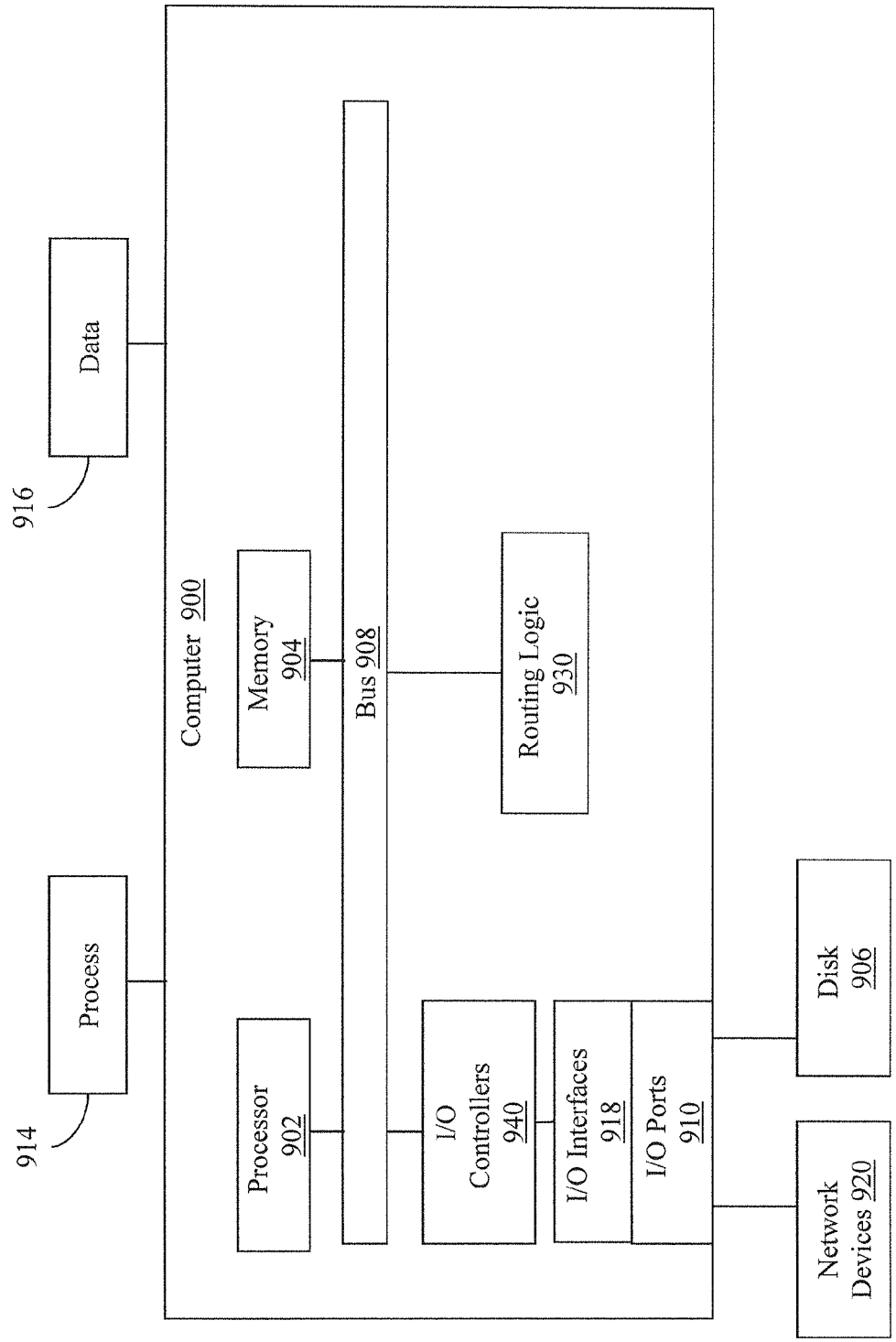
FIG. 9 illustrates an embodiment of a computing system in which example systems and methods, and equivalents, may operate.

FIG. 9 illustrates an example computing device that is configured and/or programmed with one or more of the example systems and methods described herein, and/or equivalents. The example computing device may be a computer 900 that includes a processor 902, a memory 904, and input/output ports 910 operably connected by a bus 908. In one example, the computer 900 may include routing logic 930 configured to facilitate successively routing wire interconnects in a design to mitigate wire capacitance similar to system 100 shown in FIG. 1. In different examples, the routing logic 930 may be implemented in hardware, a non-transitory computer-readable medium with stored instructions, firmware, and/or combinations thereof. While the routing logic 930 is illustrated as a hardware component attached to the bus 908, it is to be appreciated that in other embodiments, the logic 930 could be implemented in the processor 902, stored in memory 904, or stored in disk 906.

In one embodiment, logic 930 or the computer 900 is a means (e.g., structure: hardware, non-transitory computer-readable medium, firmware) for performing the actions described. In some embodiments, the computing device may be a server operating in a cloud computing system, a server configured in a Software as a Service (SaaS) architecture, a smart phone, laptop, tablet computing device, and so on.

The means may be implemented, for example, as an ASIC programmed to mitigate wire capacitance in a design by successively routing wire interconnects to use a minimum wire length. The means may also be implemented as stored computer executable instructions that are presented to computer 900 as data 916 that are temporarily stored in memory 904 and then executed by processor 902.

Logic 930 may also provide means (e.g., hardware, non-transitory computer-readable medium that stores executable instructions, firmware) for performing generating a bounding box, slicing the bounding box and otherwise calculating locations for wire interconnects in the design to minimize overall wire length.

Generally describing an example configuration of the computer 900, the processor 902 may be a variety of various processors including dual microprocessor and other multi-processor architectures. A memory 904 may include volatile memory and/or non-volatile memory. Non-volatile memory may include, for example, ROM, PROM, and so on. Volatile memory may include, for example, RAM, SRAM, DRAM, and so on.

A storage disk 906 may be operably connected to the computer 900 via, for example, an input/output interface (e.g., card, device) 918 and an input/output port 910. The disk 906 may be, for example, a magnetic disk drive, a solid state disk drive, a floppy disk drive, a tape drive, a Zip drive, a flash memory card, a memory stick, and so on. Furthermore, the disk 906 may be a CD-ROM drive, a CD-R drive, a CD-RW drive, a DVD ROM, and so on. The memory 904 can store a process 914 and/or a data 916, for example. The disk 906 and/or the memory 904 can store an operating system that controls and allocates resources of the computer 900.

The computer 900 may interact with input/output devices via the i/o interfaces 918 and the input/output ports 910. Input/output devices may be, for example, a keyboard, a microphone, a pointing and selection device, cameras, video cards, displays, the disk 906, the network devices 920, and so on. The input/output ports 910 may include, for example, serial ports, parallel ports, and USB ports.

The computer 900 can operate in a network environment and thus may be connected to the network devices 920 via the i/o interfaces 918, and/or the i/o ports 910. Through the network devices 920, the computer 900 may interact with a network. Through the network, the computer 900 may be logically connected to remote computers. Networks with which the computer 900 may interact include, but are not limited to, a LAN, a WAN, and other networks.

Definitions and Other Embodiments

In another embodiment, the described methods and/or their equivalents may be implemented with computer executable instructions. Thus, in one embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on). In one embodiment, a computing device is implemented with one or more executable algorithms that are configured to perform any of the disclosed methods.

In one or more embodiments, the disclosed methods or their equivalents are performed by either: computer hardware configured to perform the method; or computer software embodied in a non-transitory computer-readable medium including an executable algorithm configured to perform the method.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C §101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment," "an embodiment," "one example," "an example," and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

A "data structure," as used herein, is an organization of data in a computing system that is stored in a memory, a storage device, or other computerized system. A data structure may be any one of, for example, a data field, a data file, a data array, a data record, a database, a data table, a graph, a tree, a linked list, and so on. A data structure may be formed from and contain many other data structures (e.g., a database includes many data records). Other examples of data structures are possible as well, in accordance with other embodiments.

"Computer-readable medium" or "computer storage medium," as used herein, refers to a non-transitory medium that stores instructions and/or data configured to perform one or more of the disclosed functions when executed. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C §101.

"Logic," as used herein, represents a component that is implemented with computer or electrical hardware, a non-transitory medium with stored instructions of an executable application or program module, and/or combinations of these to perform any of the functions or actions as disclosed herein, and/or to cause a function or action from another logic, method, and/or system to be performed as disclosed herein. Equivalent logic may include firmware, a microprocessor programmed with an algorithm, a discrete logic (e.g., ASIC), at least one circuit, an analog circuit, a digital circuit, a programmed logic device, a memory device containing instructions of an algorithm, and so on, any of which may be configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. For example, if greater speed is a consideration, then hardware would be selected to implement functions. If a lower cost is a consideration, then stored instructions/executable application would be selected to implement the functions. Logic is limited to statutory subject matter under 35 U.S.C. §101.

An "operable connection," or a connection by which entities are "operably connected," is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

"User," as used herein, includes but is not limited to one or more persons, computers or other devices, or combinations of these.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. A non-transitory computer-readable medium storing computer-executable instructions that when executed by one or more processors of a computer cause the computer to:

load, by the one or more processors into an electronic memory, an electronic data structure that includes a design of an integrated circuit;

locate, by the one or more processors, structures that are to be electrically connected together by determining coordinates of the structures within the design;

assign, by the one or more processors, different weight values to the structures that are to be electrically connected together within the design, wherein the different weight values are assigned based on relative capacitive loads carried by the structures or relative sizes of the structures; and generate, by the one or more processors, a structured topology that controls locations of electrical connections formed between the structures during fabrication of the integrated circuit, wherein the structured topology is generated by successively routing wire interconnects in different layers of the design, wherein routing at least one of the wire interconnects comprises: (i) determining weighted coordinates for the structures by applying the different weight values to the coordinates of the structures and (ii) positioning the at least one of the wire interconnects closer to one of the structures than another of the structures based on the weighted coordinates.

2. The non-transitory computer-readable medium of claim 1, further storing instructions that when executed by the one or more processors cause the computer to:

define a region for successively routing the wire interconnects in the design by generating a bounding box from the coordinates of the structures, wherein said generating the bounding box includes defining the bounding box to encompass a rectangular footprint within the design that is bounded by outermost coordinates from the coordinates, and wherein said successively routing the wire interconnects is restricted to the region of the design defined by the bounding box.

3. The non-transitory computer-readable medium of claim 1, wherein the instructions that when executed cause the computer to generate the structured topology comprise instructions that when executed by the one or more processors cause the computer to:

generate a trunk interconnect in the design as a function of the coordinates by (i) applying one of the different weight values to the coordinates for each of the structures that are electrically connected in the design and (ii) calculating a location for the trunk interconnect from the weighted coordinates to position the trunk interconnect to mitigate lengths of wire interconnects in subsequent layers, wherein the location is calculated in one dimension of a bounding box and the trunk interconnect is generated with a length extending in a second dimension of the bounding box.

4. The non-transitory computer-readable medium of claim 1, wherein the instructions that when executed cause the computer to generate the structured topology comprise instructions that when executed by the one or more processors cause the computer to:

slice a bounding box to create bands that form sub-regions in the bounding box, wherein the bands are perpendicular to a routing direction of a trunk interconnect, assign each of the structures to one of the bands according to a position of each of the structures in relation to the bands and one or more other of the structures, generate a branch interconnect at a location in each of the bands, wherein the location of the branch interconnect in each of the bands is a function of the different weight values and coordinates of structures that are (i) electrically connected in the design and (ii) commonly assigned to each band, and wherein the branch interconnect is generated perpendicular to the trunk interconnect.

5. The non-transitory computer-readable medium of claim 4, wherein the instructions that when executed cause the computer to generate the structured topology comprise instructions that when executed by the one or more processors cause the computer to:

generate leg interconnects by creating a wire interconnect between each of the structures and a nearest branch.

6. The non-transitory computer-readable medium of claim 1, wherein the design is a design for electronic design automation, and wherein the instructions that when executed cause the computer to generate the structured topology comprise instructions that when executed by the one or more processors cause the computer to generate the interconnects with a minimum length to create a net of wire interconnects that mitigates wire capacitance in the integrated circuit, wherein the design defines layers of the integrated circuit and connections between structures and wire interconnects in the layers.

7. The non-transitory computer-readable medium of claim 1, wherein the instructions that when executed cause the computer to generate the structured topology comprise instructions that when executed by the one or more processors cause the computer to:

generate via connections in the design where wire interconnects overlap between adjacent layers, wherein the computer generates the structured topology during design of a back end of line portion of the integrated circuit.

8. The non-transitory computer-readable medium of claim 1, further comprising instructions that when executed by the one or more processors causes the computer to:

configure a design tool to mitigate wire capacitance in an integrated circuit by minimizing lengths of wire interconnects when routing the wire interconnects of the integrated circuit, wherein each of the wire interconnects is routed as a rectangular segment of metal, and wherein the design tool is configured to specify parameters that control routing of the wire interconnects in each layer of the design, wherein the parameters include a circuit device size used in the integrated circuit.

9. The non-transitory computer-readable medium of claim 1, wherein the structures include one or more of driver pins, current sinks, contacts, wires, resistors, and bonding sites, wherein a first layer that includes the structures is beneath the layers of the wire interconnects and is adjacent to a front end of line layer, wherein the instructions that, when executed by the one or more processors, cause the computer to generate wire interconnects to electrically connect a driver pin between the layers of the integrated circuit to carry electrical signals between the structures of the integrated circuit.

10. A system, comprising:

a configuration module stored in a non-transitory computer-readable medium and configured with instructions that when executed by one or more processors causes a computer to load, into an electronic memory, an electronic data structure that includes a design of an integrated circuit comprising structures designated to be electrically connected together;

a design module stored in a non-transitory computer-readable medium and configured with instructions that when executed by the one or more processors causes the computer to locate the structures that are designated to be electrically connected together by determining coordinates of the structures within the design; and a routing module stored in a non-transitory computer-readable medium and configured with instructions that when executed by the one or more processors causes the computer to: (i) assign different weight values to a plurality of the structures that are to be electrically connected together within the design, wherein the different weight values are assigned based on relative capacitive loads carried by the structures or relative sizes of the structures, (ii) generate a structured topology that controls locations of electrical connections formed between the structures during fabrication of the integrated circuit, wherein the structured topology is generated by successively routing wire interconnects in different layers of the design, wherein routing at least one of the wire interconnects comprises: (i) determining weighted coordinates for the structures by applying the different weight values to the coordinates of the structures and (ii) positioning the at least one of the wire interconnects closer to one of the structures than another of the structures based on the weighted coordinates.

11. The system of claim 10, wherein the design module further includes instructions that when executed by the one or more processors causes the computer to:
define a region for successively routing the wire interconnects in the design by generating a bounding box from the coordinates of the structures, wherein said generating the bounding box includes defining the bounding box to encompass a rectangular footprint within the design that is bounded by outermost coordinates from the coordinates, and
limit successive routing of the wire interconnects to a region of the design defined by the bounding box.

12. The system of claim 10, wherein the instructions that when executed by the one or more processors cause the computer to generate the structured topology include instructions that when executed by the one or more processors cause the computer to:
generate a trunk interconnect in the design as a function of the coordinates by (i) applying the different weight values to the coordinates for the structures and (ii) calculating a location for the trunk interconnect from the weighted coordinates to position the trunk interconnect at a location that mitigates lengths of wire interconnects in subsequent layers,
wherein the location is calculated in one dimension of a bounding box and the trunk interconnect is generated with a length extending in a second dimension of the bounding box.

13. The system of claim 10, wherein the instructions that when executed by the one or more processors cause the computer to generate the structured topology include instructions that when generated by the one or more processors causes the computer to:
slice a bounding box to create bands that form sub-regions in the bounding box, wherein the bands are perpendicular to a routing direction of a trunk interconnect,
assign each of the structures to one of the bands according to a position of each of the structures in relation to the bands and one or more other of the structures,
generate one or more branch interconnects in the bands at locations in each of the bands that are a function of the coordinates of structures assigned the different weight values and that are assigned to respective bands of the bands, and
wherein the one or more branch interconnects are generated perpendicular to the trunk interconnect.

14. The system of claim 13, wherein the instructions that when executed by the one or more processors cause the computer to generate the structured topology include instructions that when executed by the one or more processors cause the computer to:
generate leg interconnects by creating a wire interconnect between each of the structures and a nearest branch.

15. The system of claim 10, wherein the instructions that when executed by the one or more processors cause the computer to generate the structured topology include instructions that when executed by the one or more processors cause the computer to:
generate via connections in the design where wire interconnects overlap between adjacent layers, wherein the structured topology is generated during design of a back end of line portion of the integrated circuit.

16. The system of claim 10, wherein the design is a design for electronic design automation, and the instructions, when executed by the one or more processors, cause the computer to generate the interconnects with a minimum length to create a net of wire interconnects that mitigates wire capacitance in the integrated circuit, wherein the design defines the layers of the integrated circuit and connections between structures and wire interconnects in the layers, wherein the structures include one or more of driver pins, current sinks, contacts, wires, resistors, and bonding sites.

17. A method, comprising:
arranging a plurality of circuit structures in at least two different layers of an integrated circuit, wherein the circuit structures are to be electrically connected together within the integrated circuit; and
forming a structured topology comprising wire interconnects that electrically connect the circuit structures together, wherein a position of at least a first wire interconnect in the structured topology is determined by: (i) defining different weight values for the circuit structures in the integrated circuit, wherein the different weight values are defined based on relative capacitive loads carried by the circuit structures or relative sizes of the circuit structures, (ii) determining weighted coordinates for the circuit structures by applying the different weight values to coordinates of the circuit structures, and (iii) positioning the first wire interconnect closer to one of the circuit structures than another of the circuit structures based on the weighted coordinates to mitigate wire capacitance of the wire interconnects in the structured topology.

18. The method of claim 17, wherein the plurality of wire interconnects are positioned within the structured topology by arranging the wire interconnects in multiple successive layers that include a leg layer, a branch layer, and a trunk layer, wherein the wire interconnects of the successive layers are connected together and to the circuit structures to form a net, and wherein the circuit structures include current sinks and a driver pin.

19. The method of claim 18, wherein the trunk layer comprises a single trunk interconnect, and the branch layer comprises multiple branch interconnects that are linked to: the trunk interconnect using vias, and to leg interconnects of the leg layer using vias.

20. The method of claim 17, wherein the different weight values cause branch interconnects in a branch layer to be oriented perpendicular to a trunk interconnect in a trunk layer.

* * * * *